US006621151B1

(12) United States Patent
Chai et al.

(10) Patent No.: US 6,621,151 B1
(45) Date of Patent: Sep. 16, 2003

(54) LEAD FRAME FOR AN INTEGRATED CIRCUIT CHIP

(75) Inventors: Tai Chong Chai, Singapore (SG); Thiam Beng Lim, Singapore (SG); Yong Chua Teo, Singapore (SG); James Tan, Singapore (SG); Raymundo Camenforte, Singapore (SG); Eric Neo, Singapore (SG); Daniel Yap, Singapore (SG)

(73) Assignee: Institute of Microelectronics, Singapore Science Park II (SG)

( * ) Notice: Subject to any disclaimer, the term of this patent is extended or adjusted under 35 U.S.C. 154(b) by 0 days.

(21) Appl. No.: 09/497,421

(22) Filed: Feb. 7, 2000

(30) Foreign Application Priority Data

Feb. 9, 1999 (SG) .............................................. 9900055

(51) Int. Cl.[7] .............................................. H01L 23/48
(52) U.S. Cl. ...................................... 257/667; 257/676
(58) Field of Search ................................ 257/666, 676, 257/669, 680; 174/52.2, 260, 255

(56) References Cited

U.S. PATENT DOCUMENTS

| 4,884,124 | A | * | 11/1989 | Mori et al. ..................... 357/72 |
| 4,924,291 | A |   | 5/1990  | Lesk et al. |
| 4,942,452 | A | * | 7/1990  | Kitano et al. .................. 357/68 |
| 5,150,193 | A | * | 9/1992  | Yasuhara et al. ............... 357/70 |
| 5,233,222 | A | * | 8/1993  | Djennas et al. ............. 257/676 |
| 5,352,852 | A | * | 10/1994 | Chun .......................... 174/52.4 |
| 5,543,657 | A |   | 8/1996  | Diffenderfer et al. |
| 5,637,913 | A | * | 6/1997  | Kajihara et al. ............. 257/666 |
| 5,661,338 | A | * | 8/1997  | Yoo et al. ................... 257/676 |
| 5,874,773 | A | * | 2/1999  | Terada et al. ............... 257/676 |
| 6,087,715 | A | * | 7/2000  | Sawada et al. ............. 257/666 |
| 6,091,133 | A | * | 7/2000  | Corisis et al. ............. 257/666 |
| 6,130,115 | A | * | 10/2000 | Okumura et al. ........... 438/124 |
| 6,137,160 | A | * | 10/2000 | Ishikawa .................... 257/676 |
| 6,166,430 | A | * | 12/2000 | Yamaguchi ................. 257/666 |

OTHER PUBLICATIONS

Umehara, Norito et al., S–Pad Implementation; Total Plastic Package Crack Solution for Non–Moisture Sensitive Pakcage, New Package Development, Texas Instruments Japan, Ltd., Hi j. i. Plant, 4260 takao, Kawasaki, Hiji–machi, Hayami–gun Oita Japan 879–15.

Ganesan, Gans S. et al., Level I CrackFree Plastic Packaging Technology, Motorola Inc., Semiconductor Products Sector, 2100 E. Elliot Road, Tempe, AZ 85284.

Nakazawa, Tsutomu et al., A Novel Structure to Realize Crack–Free Plastic Packages During Reflow Soldering Process–Development of Chip Side Support (CSS) Package, IEEE Transactions on Components Packaging and Manufacturing Technology—Pact C, vol. 19, No. 1, Jan. 1996, pp. 61–69.

Chan, K. C. and Chai, T. C., Type II Popcorn Failure Analysis in Plastic Encapsulated IC Package Using Scanning Acoustic Microscopy and Cross–Sectioning (not yet published).

Cha, Ki–Bon et al.; Ultra–Thin and Crack–Free Bottom Leaded Plastic (BLP) Package Design; LG Semicon (Gold Star) Package R&D Center, Cheongju, Korea 360–480 0569–5503/95/0000 ©1995 IEEE.

* cited by examiner

*Primary Examiner*—Kamand Cuneo
*Assistant Examiner*—Lourdes C Cruz
(74) *Attorney, Agent, or Firm*—Dykema Gossett PLLC

(57) ABSTRACT

A lead-frame for connecting and supporting an integrated circuit having an apertured frame with dimensions smaller than the corresponding dimensions of the chip so that chip-pad shoulder can be eliminated and the chip attach fillet is made remote from the chip corner.

15 Claims, 4 Drawing Sheets

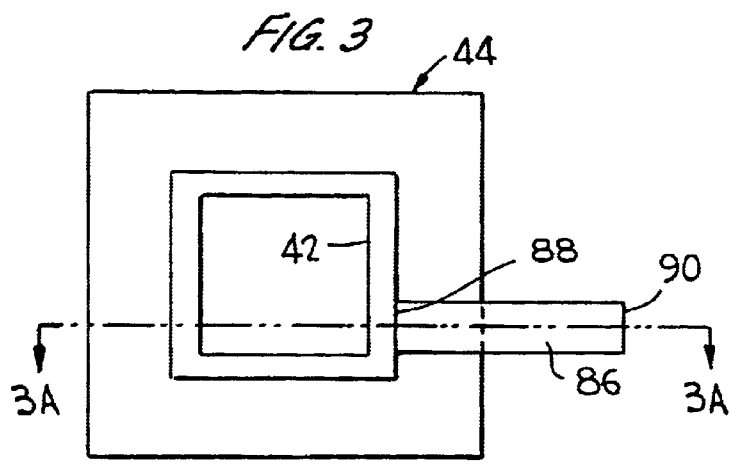
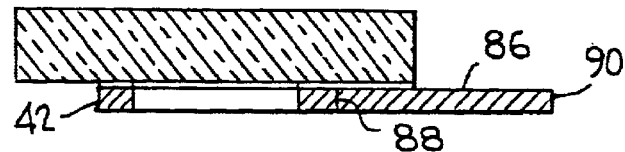
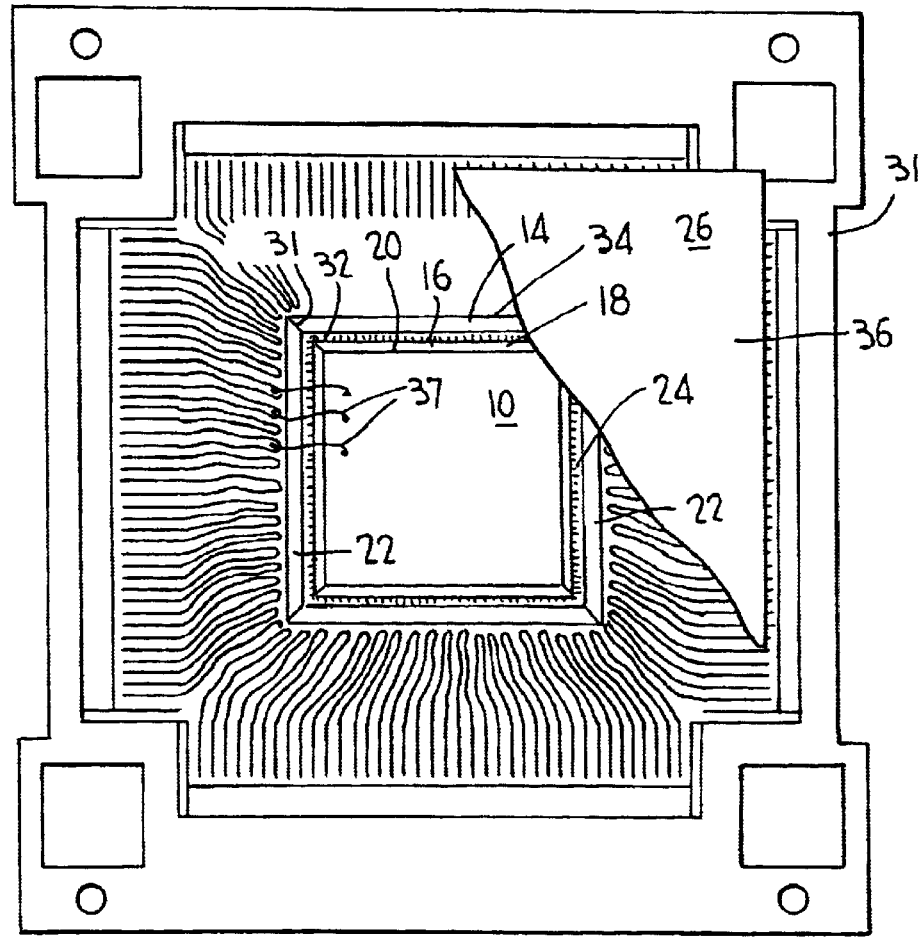

LEAD FRAME FOR AN INTEGRATED CIRCUIT CHIP

BACKGROUND OF THE INVENTION

This invention relates to packaging for a semiconductor device, and more particularly to a crack and delamination inhibiting lead frame for a semiconductor integrated circuit with a small window.

Conventional plastic semiconductor packages suffer from a failure mode referred to as "popcorn cracking." This failure mode occurs in packages that are exposed to ambient moisture and are then heated to high temperatures, typically during reflow soldering.

The problem apparently arises because plastic IC packages have a tendency to absorb moisture from the environment. The moisture diffuses into the encapsulant material and other materials such as the chip attach. During the solder reflow process, thermal vapor stresses developed at the chip attach/chip-pad interface or the encapsulant material/chip-pad interface cause delamination to occur, especially at areas of high interfacial stress.

A conventional full pad design is shown in FIGS. 6, 6A and 6B where a chip or die 10 has its lower side 12 secured to a chip pad 14 by a chip attach material 16. The chip attach 16 forms a fillet 18 between the side wall 20 of the chip 10 and the upper surface 22 of the chip pad 14 in an outer region known as the shoulder 24. The pad 14 and attached chip 10 are thereafter encapsulated in an encapsulant material 26, for example epoxy forming a package 30 in a known manner. In FIG. 6A, the package 30 is fabricated on a metal leadframe 31. The package 30 includes wire bonds 37.

The failure process appears to begin with delamination or cracking of the bond between the chip and the chip-pad. This delamination may be caused by differential expansion due to the differing coefficients of thermal expansion of adjacent materials within the package. Delamination 38 of the chip 10 from the chip pad 14 can occur when the interfacial stresses exceed the interfacial strength. Once delamination begins, it can propagate. The expanding void created by this delamination is invaded by water vapor, previously absorbed into the encapsulant material, and driven from the encapsulant by the rise in temperature. If the delamination covers a large area, the resulting long moment across which expansive water vapor forces act allows those forces to overcome the cohesive forces within the encapsulant material. In particular, delamination 38 often starts near the corner 32 of the chip 10, where the chip 10 meets the shoulder 24. In the case of the full pad design shown, delamination can rapidly propagate over the entire pad area. This can cause the package 30 to crack from the outer edge 34 of the chip pad 14 where the cohesive strength of the encapsulant material 26 is exceeded. The resulting crack may propagate through the encapsulant material 26 to the outer surface 36 of the package 30. In a like manner, delamination of the chip pad 14 from the encapsulant material 26 can also act as a crack source resulting in a popcorn failure.

These problems necessitate storage of components in humidity controlled environments prior to reflow soldering. Such required storage procedures represent additional cost and uncertainty in product quality.

SUMMARY OF THE INVENTION

The invention is based upon the discovery that a lead frame for a crack resistant integrated circuit package has an apertured frame, of reduced size, smaller than the integrated circuit. In a package utilizing the lead frame, the integrated circuit or chip is attached to the upper surface of the frame, and encapsulant material encloses and surrounds the frame and the chip. The encapsulant material bonds to a majority of the surface area of the chip and hardens to complete the package.

The invention provides a lead frame that reduces the initial adhesive failure, or delamination, that can occur during high temperature exposure that results in popcorn cracking. In an exemplary embodiment, this is achieved by reducing or minimizing the size of the attachment surface of the frame to the chip. The minimal attachment surface limits the propagation of cracks and increases the available bonding surface area below the chip and encapsulant.

BRIEF DESCRIPTION OF THE DRAWINGS

The objects and advantages of the present invention will become apparent by reference to the following description and accompanying drawings wherein:

FIG. 3 is a plan view of a SWCS design employing a grounding lead;

FIG. 3A is a cross section of the SWCS of FIG. 3, taken along line 3A—3A thereof;

FIG. 6 is a fragmentary plan view of a conventional integrated circuit package formed on a thin metal leadframe and employing a conventional full size chip pad;

DETAILED DESCRIPTION OF THE INVENTION

Figure 1:
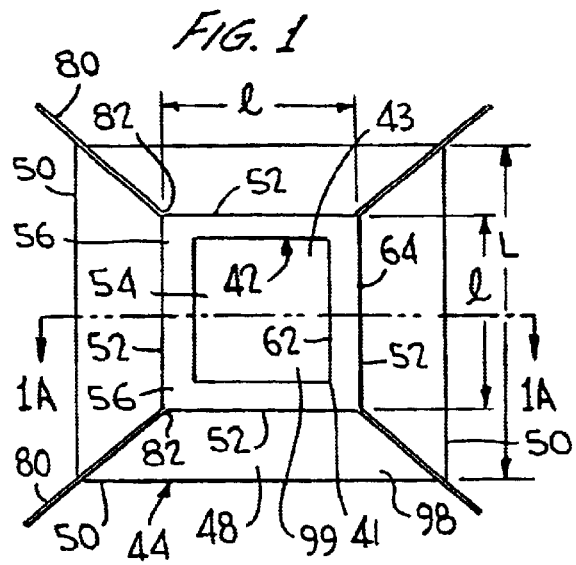
FIG. 1 is a bottom plan view of a Small-Window-Chip-Support (SWCS) lead frame according to an exemplary embodiment of the invention.
Figure 1A:
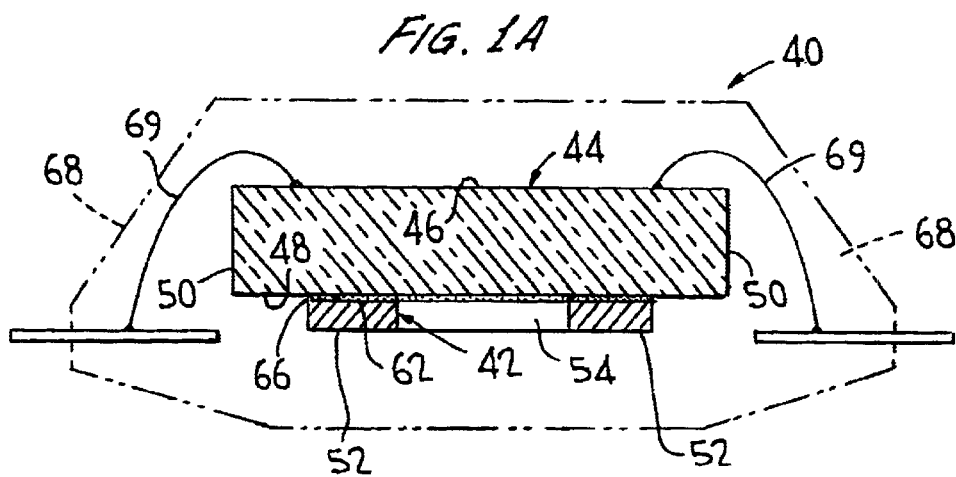
FIG. 1A is a cross section of the SWCS lead frame of FIG. 1, taken along line 1A—1A.

FIGS. 1 and 1A illustrate an exemplary embodiment of a portion of an integrated circuit package incorporating a small window chip support lead frame 42 for an integrated circuit chip or die 44 according to the invention. The chip 44 has a respective top 46, and bottom 48. It also has sides 50 and side edges 55. The lead frame 42 reduces or eliminates popcorn cracking failures during periods of high temperature processing; for example, during reflow soldering.

In the present embodiment, the lead frame 42 includes four interconnected coplanar sidebars 52 defining an aperture or window 54. In this embodiment, each sidebar 52 also has opposite ends 56 and respective inner sides 62 and outer sides 64. The outer sides 64 define a chip supporting zone 43. It is characteristic of the invention that the chip supporting zone 43 has a periphery lying generally within the periphery of the chip. In most instances, the entire lead frame 42 is etched or stamped from a thin conductive metal sheet, for example copper sheet. Typically, the thickness of the metal sheet is in the range from about 4 mils to about 8 mils. Other materials and thicknesses may be appropriate for various applications.

The sidebars 52 are joined at respective ends 56 to define the aperture 54. A chip contacting surface comprising the upper surface 63 of each side bar 52 is disposed in confronting relation with the bottom 48 of the chip 44. As shown, the chip 44 is secured to the upper surface 63 of each side bar 52 by a chip attach material 66. The sides 50 of chip 44 are then located in spaced relation with the outer side 64 of the side bars 52 as shown.

In a known manner wire bonds 69 are connected to the top 46 of the chip 44 as schematically shown. Encapsulation material 68, shown in dotted line, is molded around the frame 42 and chip 44 as shown. The encapsulation material 68 forms a bond with the frame 42 and also bonds to the top 46, bottom 48 and sides 50 of the chip 44. As can be appreciated the encapsulating material 68 is molded through and around the frame 42 to form a firm and robust bond with the bottom 48 of the chip 44 through the aperture 54.

As noted above, the chip 44 is secured to a portion of the top surface 63 of the side bars 52 by the chip attach material, or adhesive, 66. The arrangement of chip and sidebars, discussed above, whereby the periphery of the chip supporting zone is within the periphery of the chip insures that the die attach material contacts the bottom of the chip remotely from the high-stress chip corners 41. As best shown in FIG. 1 the chip 44 is supported on the frame 42 with its sides 50 generally parallel to and spaced beyond the side bars 52, exposing available inner 98 and outer 99 bonding areas on the bottom of the chip. This allows the encapsulation material to bond to both areas on the bottom of the chip and around the frame 42 to provide a strong bond.

The upper surface 63 of each side bar 52 provides a relatively small contact area with the chip. Such a small total bonding area minimizes possible delamination span, and the consequent probability of popcorn cracking. A window format, as compared with less integrated alternatives, is used to enhance mechanical stability during assembly prior to mold encapsulation.

As can be seen in FIG. 1 and FIG. 1A, the apertured frame 42 is surrounded by different materials including the encapsulating material 68, which thus forms materials discontinuities at various boundaries in the package 40. Accordingly, cracks originating at the interface in the chip attach material 66 between the chip 44 and the frame 42, tend to stop at the boundary where the materials are discontinuous.

Side bars 52 have a length 1. Importantly, the side bar length I is at the outer side 64 generally less than the corresponding length L of the chip along the side edge 55 to thereby eliminate the chip-pad shoulder 24 and the chip-pad attach fillet 18 of the prior art.

As can be seen in FIG. 1, although the frame 42 provides a relatively small contact area for the chip 44, it is sufficient to secure the chip 44 in place while the assembly is being encapsulated. Significantly, the lead frame exhibits no shoulder region, and all die attach interfaces are remote from chip corners. Consequently the weaker materials, more prone to delamination, are not found in the high stress corner and shoulder regions. The resulting package 40 is robust, ultimately providing relatively high strength bonds between the chip and frame upon encapsulation. The permanent bond formed between the chip 44 and the encapsulation 68 has a large surface area relative to the chip attach bond. Failure of the chip attach after encapsulation thus does not adversely affect package integrity because of the superior strength of the encapsulating material.

The lead frame also includes support members 80 which extend from the corners 82 of the frame 42. The support members serve to support the sidebars 52 within the mold during application and hardening of the encapsulant material.

Various other embodiments of the invention provide advantages complimentary to those already described.

Figure 2:
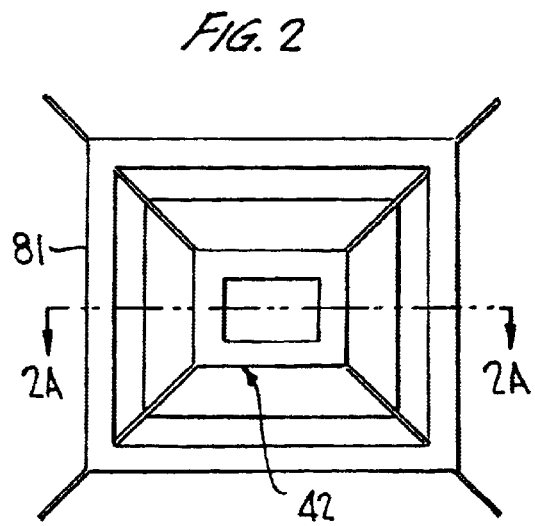
FIG. 2 is a plan view of a SWCS design employing grounding ring.
Figure 2A:
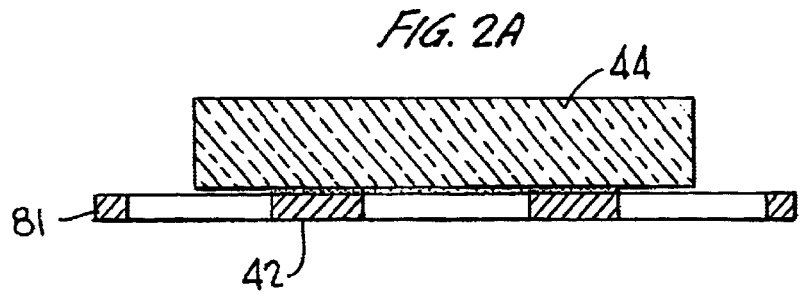
FIG. 2A is a cross section of the SWCS of FIG. 2, taken along line 2A—2A thereof.

FIGS. 2 and 2A illustrate a ground ring 81 which surrounds the chip 44 and is in spaced relation therewith. As shown, the ground ring 81 is electrically conductive and forms a ground plane for the chip 44.

FIGS. 3 and 3A illustrates an arrangement with a ground lead 86 having a proximal of end 88 connected to the frame 42 and having a free end 90 for ground wire bonding if needed.

Figure 4:
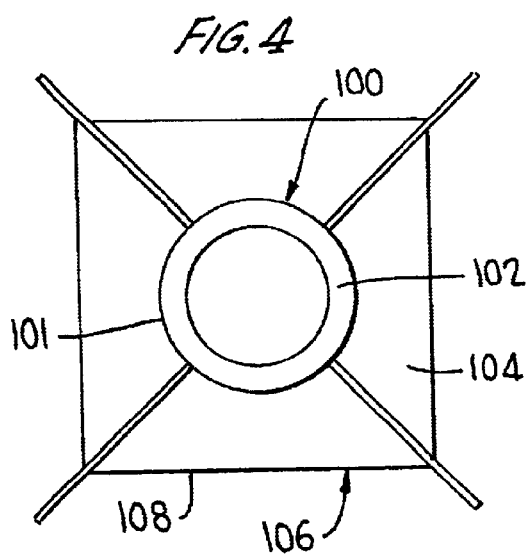
FIG. 4 illustrates a small window arrangement with a round apertured frame.

FIG. 4 illustrates a small window arrangement with a round apertured frame. In this embodiment, the function of the sidebars 52, as illustrated in FIG. 1 is performed by a circular or annular member 100 with a circumferential edge 101 and upper surface 102 fixed in bearing contact with the bottom 104 of the chip 106, and disposed within the chip edge 108.

Figure 5:
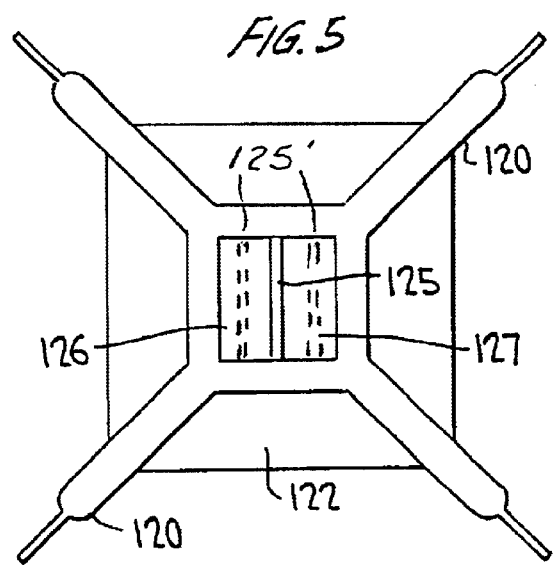
FIG. 5 illustrates a small window arrangement with enlarged support members.
Figure 6A:
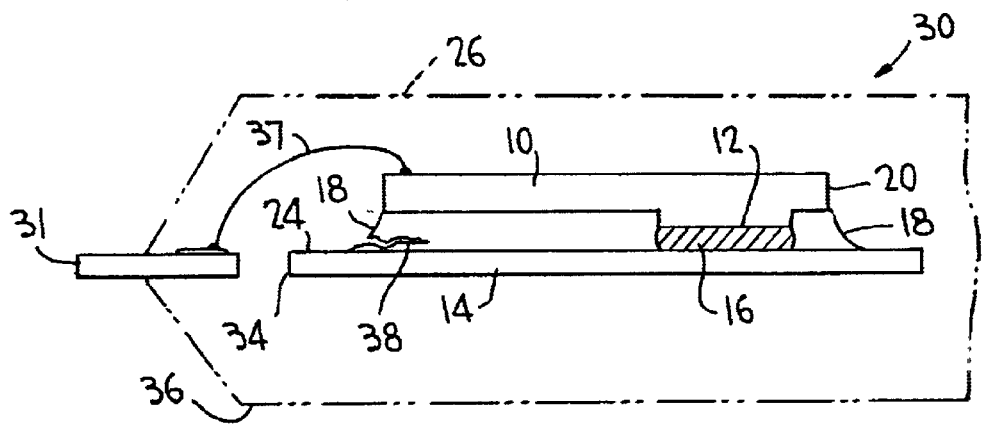
FIG. 6A is a fragmentary side elevation of the lead frame of FIG. 6.
Figure 6B:
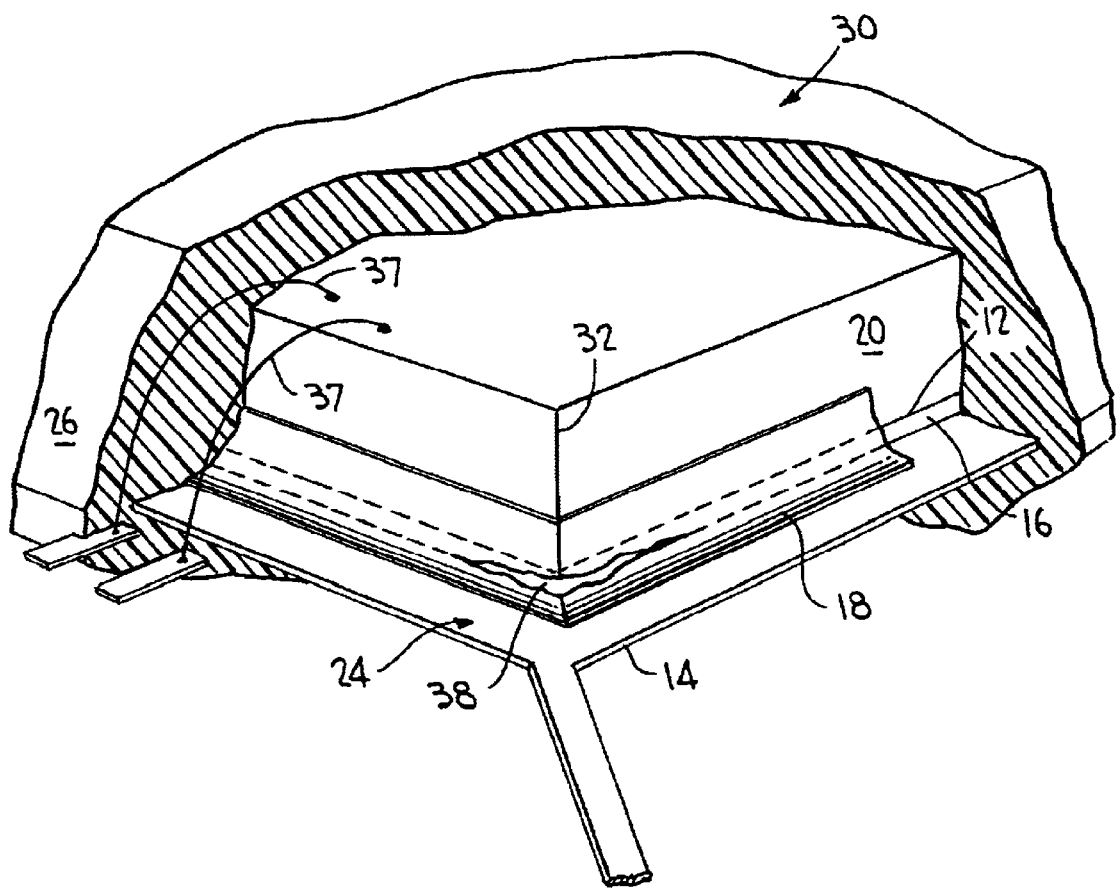
FIG. 6B is a fragmentary perspective view of the lead frame of FIG. 6.

FIG. 5 illustrates a small window arrangement with enlarged support members 120.

This arrangement presents additional surface area to the bottom of the chip 122, and provides additional stability during the molding of encapsulant material, and possibly thermal benefits in operation.

FIG. 5 further illustrates an aperture traversing member 125. In this embodiment, this member serves to divide the aperture into two smaller apertures 126 and 127. Additional traversing members 125' (shown in dotted line) may be employed to further divide the apertures 126 and 127 into smaller areas.

It will be appreciated by persons skilled in the art that numerous variations and modifications may be made to the invention as shown in the specific embodiments without departing from the spirit or scope of the invention as broadly described. The present embodiments are therefore to be considered in all respects illustrative and not restrictive.

We claim:

1. A lead frame, for an integrated circuit chip having a frame engaging bottom surface for attachment to the frame by means of a chip attach material, said chip being formed with outer edges having defined dimensions, said frame comprising:

a unitary apertured frame having a central through aperture therein including a plurality of uniform sidebars each having an upper chip-supporting surface for engaging the bottom of the surface of the chip with the chip attach material therebetween, each of said sidebars having an inner edge and an outer edge, said inner edges defining the central aperture, said inner and outer edges being uniformly spaced apart defining therebetween a chip-support zone having defined dimensions, said outer edges of the sidebars being recessed from the outer edges of the chip such that the frame is smaller than a corresponding dimension of the chip, so as to avoid formation of a fillet of chip attach material proximate to the outer edges of the chip when the chip is attached to the frame.

2. The lead frame of claim 1, wherein said chip-supporting surface engages the bottom of the chip at a location remote from higher stress regions associated with corners of the chip.

3. The lead frame of claim 1 wherein at least one of said sidebars is generally rectilinear.

4. The lead frame of claim 1 wherein at least one of said sidebars is generally curvilinear.

5. The lead frame of claim 1, further comprising: one or more aperture traversing members, said members serving to divide said aperture into a plurality of smaller apertures.

6. The lead frame of claim 1, further comprising:
a plurality of support members having proximal and distal ends, each support member being connected to at least one sidebar by said proximal end thereof.

7. The lead frame of claim 1 wherein said sidebars further comprise: opposite ends, said opposite ends intersecting to define corners.

8. The lead frame of claim 7, further comprising:
a plurality of support members having proximal and distal ends, each support member being connected to at least one sidebar by said proximal end thereof, defining a connection.

9. The lead frame of claim 1, further comprising a ground ring surrounding the chip in spaced relation thereabout.

10. The lead frame of claim 1, further comprising:
a plurality of leads, said leads being electrically isolated from said sidebars and disposed outside of said aperture, each of said leads having a proximal end and a distal end, said proximal end being proximate to said sidebars.

11. A lead frame for connecting and supporting an integrated circuit chip having an outer chip edge, comprising a frame including interconnected side bars having a uniform width defining a central aperture and an outer frame edge, said frame edge being disposed within the outer chip edge, thus having no shoulder, and therefore minimizing filet formation, and having a contact surface for securing the chip thereto.

12. A lead frame for an integrated circuit chip having a frame-engaging bottom surface, comprising a plurality of sidebars having a uniform width, each of said sidebars having an inner side and an outer side, said sidebars defining a central aperture, said frame being sized to be accommodated entirely within corresponding outer edges of the circuit chip, each side bar having an upper chip-supporting surface for engaging the bottom surface of the chip.

13. A lead frame for an integrated circuit chip having a frame engaging bottom surface comprising:
a generally circular frame having a central aperture forming an inner edge and an outer peripheral edge defining a contact surface having a uniform width for securing the chip thereto, said edge being disposed within an outer chip edge for minimizing fillet formation.

14. The lead frame of claim 1, wherein said chip-supporting surface engages the bottom of the chip at a location remote from higher stress regions associated with the chip.

15. A lead frame, for an integrated circuit chip having a frame engaging bottom surface for attachment to the frame by means of a chip attach material, said chip being formed with outer edges having defined dimensions, said frame comprising:
a unitary apertured frame having a chip-supporting surface for engaging the bottom of the surface of the chip with the chip attach material therebetween, said frame having an outer edge, and an aperture formed with an inner edge defining the through central aperture, said inner and outer edges being uniformly spaced apart defining therebetween a chip-support zone having defined dimensions, said outer edge of the apertured frame being recessed from the outer edges of the chip such that the frame is smaller than a corresponding dimension of the chip, so as to avoid formation of a fillet of chip attach material to the outer edges of the chip when the chip is attached to the apertured frame.

* * * * *